United States Patent [19]
Schulz et al.

[11] Patent Number: 6,038,164
[45] Date of Patent: Mar. 14, 2000

[54] SRAM CELL CONFIGURATION AND METHOD FOR ITS FABRICATION

[75] Inventors: Thomas Schulz; Thomas Aeugle; Wolfgang Rösner, all of München; Lothar Risch, Neubiberg, all of Germany

[73] Assignee: Siemens Aktiengesellschaft, Munich, Germany

[21] Appl. No.: 09/200,071

[22] Filed: Nov. 25, 1998

[30] Foreign Application Priority Data

Nov. 27, 1997 [DE] Germany .................. 197 52 624

[51] Int. Cl.$^7$ .................................................. G11C 11/00
[52] U.S. Cl. .................. 365/154; 365/180; 365/188; 257/385
[58] Field of Search ........................ 365/154, 180, 365/188; 257/385

[56] References Cited

U.S. PATENT DOCUMENTS

| | | | |
|---|---|---|---|
| 4,794,561 | 12/1988 | Hsu | 365/154 |
| 5,166,902 | 11/1992 | Silver | 365/182 |
| 5,364,810 | 11/1994 | Kosa et al. | |
| 5,394,358 | 2/1995 | Huang | |
| 5,398,200 | 3/1995 | Mazuré et al. | 365/174 |
| 5,554,870 | 9/1996 | Fitch et al. | 257/334 |
| 5,670,803 | 9/1997 | Beistein, Jr. et al. | 257/278 |
| 5,955,768 | 9/1999 | Liaw et al. | 257/383 |

FOREIGN PATENT DOCUMENTS 0 477 995 A1  4/1992  European Pat. Off. .

OTHER PUBLICATIONS

"SRAM Cell Designs Advance", Industry News, Semiconductor International, Nov. 1996.
Copy of copending U.S. application No. 09/138,160.

Primary Examiner—David Nelms
Assistant Examiner—Tuan T. Nguyen
Attorney, Agent, or Firm—Herbert L. Lerner; Laurence A. Greenberg

[57] ABSTRACT

The SRAM cell configuration has at least six transistors in each memory cell. Four of the transistors form a flip-flop and they are arranged at the corners of a quadrilateral. The flip-flop is driven by two of the transistors, which are disposed so as to adjoin diagonally opposite corners of the quadrilateral and outside the quadrilateral. Adjacent memory cells along a word line can be arranged in such a way that a first bit line and a second bit line of the adjacent memory cells coincide. The transistors are preferably vertical and are arranged at semiconductor structures (St1, St2, St3, St4, St5, St6) produced from a layer sequence. Two of the transistors having n-doped channel regions are preferably formed in each case on two semiconductor structures.

8 Claims, 11 Drawing Sheets

SRAM CELL CONFIGURATION AND METHOD FOR ITS FABRICATION

BACKGROUND OF THE INVENTION

Field of the Invention

The invention relates to an SRAM cell configuration in which a memory cell comprises at least six transistors, and also to a method for its fabrication.

An SRAM cell configuration is a memory cell configuration with random access to stored information. In contrast to a DRAM cell configuration, in which the information has to be refreshed at regular intervals, the information in an SRAM cell is stored statically.

In SRAM cell configurations, use is increasingly being made of so-called 6 T memory cells, that is to say memory cells having six transistors. A 6 T memory cell comprises four MOS transistors interconnected as flip-flop and two selection transistors. The flip-flop is in one of two stable states. The state of the flip-flop represents a logic value, 0 or 1. By driving the selection transistors via a word line, it is possible, via two bit lines, both to determine the state and thus to read out the information and also to change the state and thus store a new item of information.

Since the storage density increases from memory generation to memory generation, it is necessary to reduce the required area of the 6 T memory cell from generation to generation.

A 6 T memory cell that can be fabricated with an area of $55F^2$ (F is the minimum structure size that can be fabricated using the respective technology), is presented in *Semiconductor International* (Nov. 1996), pages 19 and 20. Use is made of self-aligned, i.e. fabricated without the use of masks to be aligned, contacts and also local connections, i.e. connections situated within the cell.

SUMMARY OF THE INVENTION

It is accordingly an object of the invention to provide an SRAM cell configuration with 6 T memory cells, which overcomes the above-mentioned disadvantages of the heretofore-known devices and methods of this general type and which can be fabricated with an increased packing density in comparison with the prior art. It is a further embodiment of the invention to specify a method for fabricating such an SRAM cell configuration.

With the foregoing and other objects in view there is provided, in accordance with the invention, an SRAM cell configuration, comprising:

a plurality of memory cells each including at least a first transistor, a second transistor, a third transistor, a fourth transistor, a fifth transistor, and a sixth transistor;

the first transistor, the second transistor, the third transistor, and the fourth transistor forming a flip-flop circuit connected between a first voltage terminal and a second voltage terminal, and being driven via the fifth transistor and via the sixth transistor;

the third transistor and the fourth transistor being complementary to the first transistor and to the second transistor;

a first bit line, a second bit line, and a word line, the first bit line and the second bit line extending transversely with respect to the word line;

the fifth transistor and the sixth transistor being driven via the word line;

the fifth transistor having a second source/drain region connected to the first bit line;

the sixth transistor having a second source/drain region connected to the second bit line;

the first transistor, the second transistor, the third transistor, and the fourth transistor being arranged at corners of a quadrilateral whereby the first transistor and the fourth transistor is disposed at diagonally opposite corners thereof;

the third transistor being arranged between the first transistor and the fifth transistor; and the second transistor being arranged between the fourth transistor and the sixth transistor.

In other words, the novel circuit has a plurality of a memory cells each comprising at least a first transistor, a second transistor, a third transistor, a fourth transistor, a fifth transistor and a sixth transistor. The first transistor, the second transistor, the third transistor and the fourth transistor form a flip-flop circuit which is driven via the fifth transistor and via the sixth transistor and is connected between a first voltage terminal and a second voltage terminal. The third transistor and the fourth transistor are complementary to the first transistor and to the second transistor. The fifth transistor and the sixth transistor are driven via a word line. A second source/drain region of the fifth transistor is connected to a first bit line and a second source/drain region sixth transistor is connected to a second bit line. The first bit line and the second bit line run transversely with respect to the word line. The first transistor, the second transistor, the third transistor and the fourth transistor are arranged at corners of a quadrilateral, so that the corner at which the first transistor is arranged and the corner at which the fourth transistor is arranged are situated diagonally opposite one another. The third transistor is arranged between the first transistor and the fifth transistor. The second transistor is arranged between the fourth transistor and the sixth transistor.

This configuration affords the advantage that the word line, the first bit line, the second bit line, the connection to the first voltage terminal and the connection to the second voltage terminal can be designed as essentially straight structures in strip form. Since structures in strip form can be arranged close together, the SRAM cell configuration can be fabricated with an increased packing density.

Furthermore, the first bit line and the second bit line can be arranged next to one another, with the result that they can be designed as parts of the substrate. If the bit lines are arranged above the substrate, then both bit lines, if they are arranged next to one another, can be produced from a single metallization plane, which means that the process is simplified.

The connecting line between the first transistor, the third transistor and the fifth transistor runs parallel to the word line. The connecting line between the sixth transistor, the second transistor and the fourth transistor runs parallel to the word line. The connecting line between the first transistor and the second transistor runs parallel to a z-axis, which intersects the word line. The connecting line between the third transistor and the fourth transistor runs parallel to the z-axis. The connecting line between the fifth transistor and the sixth transistor intersects the z-axis and runs transversely with respect to the direction of the word line.

It lies within the scope of the invention, for the purpose of improving various properties of the SRAM cell configuration, to integrate further components, such as, for example, capacitors, resistors, diodes or further transistors, into the memory cell in addition to the six transistors of the memory cell.

The first transistor, the third transistor and the fifth transistor can be arranged next to one another in the word line direction. The second transistor, the fourth transistor and the sixth transistor can likewise be arranged next to one another in the word line direction. A connecting line between the corner at which the first transistor is arranged and the corner at which the second transistor is arranged can run parallel to the z-axis. A connecting line between the corner at which the third transistor is arranged and the corner at which the fourth transistor is arranged can run parallel to the z-axis. In this configuration, it is advantageous for the purpose of increasing the packing density if the first bit line, the second bit line, the connection to the first voltage terminal and the connection to the second voltage terminal are in strip form and run essentially parallel to the z-axis. The connection to the first voltage terminal can overlap the corner at which the first transistor is arranged and the corner at which the second transistor is arranged. The connection to the second voltage terminal can overlap the corner at which the third transistor is arranged and the corner at which the fourth transistor is arranged.

The quadrilateral may be a rectangle whose sides form four essentially right angles.

A first memory cell and a second memory cell which are adjacent to one another along the word line can be constructed such that they are translationally symmetrical or rotationally symmetrical through 180° relative to one another. This enables the packing density to be increased since the memory cells can be strung together without any loss of area. A connecting line between one of the transistors of the first memory cell and one of the transistors of the second memory cell runs parallel to the z-axis. In this case, the transistor of the first memory cell may be the fifth or the sixth transistor. The same applies to the transistor of the second memory cell. Preferably, the transistor of the first memory cell is the fifth transistor of the first memory cell if the transistor of the second memory cell is the sixth transistor of the second memory cell, or the sixth transistor of the first memory cell if the transistor of the second memory cell is the fifth transistor of the second memory cell. In order to increase the packing density, a first bit line of the first memory cell serves as second bit line of the second memory cell.

In order to increase the packing density, it is advantageous if a first contact to the word line contact-connects both a gate electrode of the sixth transistor (also designated as "sixth gate electrode" in the following text) and a gate electrode of the fifth transistor (also designated as "fifth gate electrode" in the following text) of two adjacent memory cells along the word line. This results in only two half contacts to the word line per memory cell.

It lies within the scope of the invention to form the first bit line, the second bit line, the connection to the first voltage terminal and/or the connection to the second voltage terminal as doped regions in a substrate. As an alternative, they can be formed as conductive structures above the substrate and/or adjoining the substrate.

In order to increase the packing density, it is advantageous if the first transistor, the second transistor, the third transistor, the fourth transistor, the fifth transistor and/or the sixth transistor are vertical MOS transistors.

It is further possible, in accordance with the invention, to arrange the transistors on sidewalls of at least one semiconductor structure. The cross section of the semiconductor structure may be as desired. In particular, the semiconductor structure may be annular, which results in a large channel width in conjunction with a particularly high packing density. In order to simplify the process, it is advantageous if the semiconductor structure has the shape of a web or a short, narrow ridge.

Lower source/drain regions of the transistors can be arranged within the semiconductor structure. In order to avoid punch-through or capacitances which are each formed by an upper and a lower source/drain region, it is advantageous if the lower source/drain regions are arranged laterally with respect to the semiconductor structures in a manner adjoining the sidewalls of the semiconductor structures. In this case, upper source/drain regions and lower source/drain regions of a transistor can be produced simultaneously and in a self-aligned manner with respect to one another and with respect to the semiconductor structure, that is to say without using masks to be aligned, by means of implantation. This firstly reduces the process complexity and, secondly, admits particularly small structure sizes since alignment tolerances do not have to be taken into account.

In accordance with another possibility, a plurality of transistors can be arranged on a semiconductor structure. This makes it possible for connections between source/drain regions of the transistors to run within the semiconductor structure, which both reduces the process complexity and increases the packing density. In order to isolate source/drain regions from one another, depressions can be produced in the semiconductor structure.

For a balanced switching behavior of p-channel transistors and n-channel transistors it is advantageous if the channel width of p-channel transistors is about twice as large as the channel width of n-channel transistors. For example, the channel widths of the third transistor and of the fourth transistor may be twice as large as the channel widths of the first transistor and of the second transistor. In order to simplify the process, semiconductor structures of identical size can be produced, p-channel transistors can each be arranged on sidewalls of two semiconductor structures and n-channel transistors can each be arranged on sidewalls of one semiconductor structure.

In order to increase the packing density, it is advantageous if the fifth transistor and the sixth transistor are n-channel transistors.

With the above and other objects in view there is also provided, in accordance with the invention, a method of fabricating an SRAM cell configuration, which comprises:
producing memory cells each comprising a first transistor, a second transistor, a third transistor, a fourth transistor, a fifth transistor, and a sixth transistor, and forming the third and fourth transistors complementary to the first and second transistors;
disposing the first, second, third, and fourth transistors at respective corners of a quadrilateral, and placing the first transistor at a corner diagonally opposite from the fourth transistor;
disposing the third transistor between the first transistor and the fifth transistor;
disposing the second transistor between the fourth transistor and the sixth transistor;
connecting the first transistor, the second transistor, the third transistor, and the fourth transistor to form a flip-flop circuit, and connecting the fifth transistor and the sixth transistor for driving the flip-flop circuit;
connecting the flip-flop circuit to a first voltage terminal and to a second voltage terminal;
forming a word line for driving the fifth transistor and the sixth transistor;
connecting a second source/drain region of the fifth transistor to a first bit line running transversely with respect to the word line; and connecting a second source/drain region of the sixth transistor to a second bit line running transversely with respect to the word line.

The semiconductor structures are produced, for example by producing a layer sequence that comprises at least a first layer, which is doped by a first conductivity type, a second layer which lies above said first layer and is doped by a second conductivity type, opposite to the first conductivity type, a third layer, which lies above said second layer and is doped by the first conductivity type, and a fourth layer which lies above said third layer and is doped by the second conductivity type. It lies within the scope of the invention to arrange auxiliary layers between these layers. The semiconductor structures are produced by multistage masked etching of the layer sequence. In order that both NMOS and PMOS transistors can be produced from a layer sequence, mutually complementary transistors are arranged at different heights. Parts of the second layer and of the third layer which are situated in the semiconductor structures are suitable as channel regions, for example. It lies within the scope of the invention to produce further doped layers as part of the layer sequence and also to arrange transistors which are not mutually complementary at different heights. In addition, it is then possible to form channel regions of mutually complementary transistors in nonadjoining layers of the layer sequence.

The first layer may be n-doped or p-doped.

The layer sequence can be produced for example by means of epitaxy and/or by means of implantation. Instead of a homogeneously doped layer, it is also possible to use a layer having doped regions. This constitutes pre-structuring, which reduces the process complexity with regard to the structuring of the layer sequence and the production of conductive structures, such as bit lines, for example.

Leakage currents on account of parasitic bipolar transistors can be suppressed if a channel current can develop in the whole channel region. Therefore, it is advantageous if a cross section through the semiconductor structures which runs perpendicularly to the channel current is particularly small. For this purpose, the semiconductor structures can be produced with the aid of a mask with dimensions that are smaller than the minimum structure size F that can be fabricated in the technology used. The mask can be produced for example by undercutting a structured layer. As an alternative, the mask may be in a spacer form, for example. The mask in spacer form is produced for example at an edge of a structured auxiliary layer by depositing material and etching it back. The resultant spacers can then additionally be structured.

In accordance with another feature of the invention, each transistor is formed on at least one semiconductor structure. In order to produce the semiconductor structures, for example, a first auxiliary layer is deposited onto the layer sequence. Trenches running parallel to the z-axis are produced in the first auxiliary layer. Spacers are produced on sidewalls of the trenches by depositing and etching back material. The spacers are structured with the aid of a mask which covers regions in strip form running transversely with respect to the trenches, as a result of which a first mask is produced from the spacers. With the aid of the first mask, the layer sequence is etched until the second layer is partially uncovered. In the process, semiconductor structures of transistors having channel regions doped by the first conductivity type are produced and temporary semiconductor structures are also produced. Semiconductor structures of the transistors having channel regions doped by the second conductivity type are produced from the temporary semiconductor structures by the layer sequence being etched, with the aid of a second mask which covers at least the semiconductor structures of the transistors having channel regions doped by the first conductivity type and also surrounding regions, until the first layer is partially uncovered. It is advantageous if the second mask is in strip form and its strips run parallel to the z-axis. As a result, conductive structures, such as bit lines, for example, can be produced from parts of the first layer and of the second layer.

In order to insulate adjacent transistors from one another it is advantageous if the layer sequence is etched, with the aid of a mask which covers at least the semiconductor structures of the transistors having channel regions doped by the first conductivity type and surrounding regions, until the third layer and the substrate are partially uncovered. A further advantage is that superfluous parts of the fourth layer in the semiconductor structures of the transistors having channel regions doped by the second conductivity type are removed in the process.

In accordance with again a further feature of the invention, the implantation is carried out with the aid of a fourth mask in strip form, whose strips run parallel to the z-axis and which covers transistors having channel regions doped by the first conductivity type and regions surrounding them. This increases the dopant concentration of the source/drain regions of the transistors having channel regions doped by the second conductivity type in a self-aligned manner, that is to say without using additional masks to be aligned, in upper parts of the semiconductor structures and also laterally adjoining the semiconductor structures. Doped regions in strip form running in the first layer are also produced in the process. With the aid of a fifth mask, which is complementary to the fourth mask, the dopant concentration of the source/drain regions of the transistors having channel regions doped by the first conductivity type is increased by means of implantation. Doped regions in strip form are formed in the first layer in the process. A first doped region of the doped regions in strip form, which comprises a first source/drain region of the first transistor and a first source/drain region of the second transistor, is connected to the first voltage terminal. The first doped region can be formed in the first layer or in the second layer. A second doped region of the doped regions in strip form, which comprises a second source/drain region of the third transistor and a second source/drain region of the fourth transistor is connected to a second voltage terminal. Other doped regions of the doped regions in strip form which comprise a second source/drain region of the sixth transistor and/or a second source/drain region of the fifth transistor, are suitable as second bit line and/or first bit line.

In order to reduce the capacitance formed by a gate electrode and a source/drain region situated underneath, it is advantageous to produce a spacer layer on the source/drain region. For this purpose, for example anisotropically insulating material is applied and removed again isotropically, with the result that the material is completely removed from sidewalls of the semiconductor structures and a spacer layer is produced on horizontal areas.

In accordance with again an additional feature of the invention, conductive material is deposited, after the production of a gate dielectric, and the conductive material is etched with the aid of a sixth mask, which covers regions between the transistors in such a way that the following are formed: gate electrodes surrounding the semiconductor structures, a first conductive structure, which overlaps the sixth gate electrode and the fifth gate electrode along the word line of adjacent memory cells, between the first transistor and the second transistor a second conductive structure, which overlaps a second gate electrode of the second transistor ("second gate electrode"), between the second transistor and the fourth transistor a third conductive structure, which overlaps the second gate electrode and a gate electrode of the fourth transistor ("fourth gate electrode"), between the third transistor and the fourth transistor a fourth conductive structure, which overlaps a gate electrode of the third transistor ("third gate electrode"), and between the first transistor and the third transistor a fifth conductive structure, which overlaps the first gate electrode and the third gate electrode.

In order to set the threshold voltage, it is possible to dope the channel regions by means of inclined implantation.

In order to reduce a resistance between source/drain regions and contacts, or conductive structures, it is advantageous to form a silicide layer by means of siliconization on the relevant source/drain regions.

The layer sequence according to the invention may contain a silicon layer and/or an Si(l-x)Gex layer.

The substrate may be, for example, a semiconductor wafer or an SOI substrate, that is to say a substrate comprising a thin monocrystalline silicon layer on an $SiO_2$ layer.

Other features which are considered as characteristic for the invention are set forth in the appended claims.

Although the invention is illustrated and described herein as embodied in a SRAM cell configuration and method for its fabrication, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

It should be understood that the figures of the drawing are not true to scale.

DESCRIPTION OF THE PREFERRED EMBODIMENTS

Figure 1:
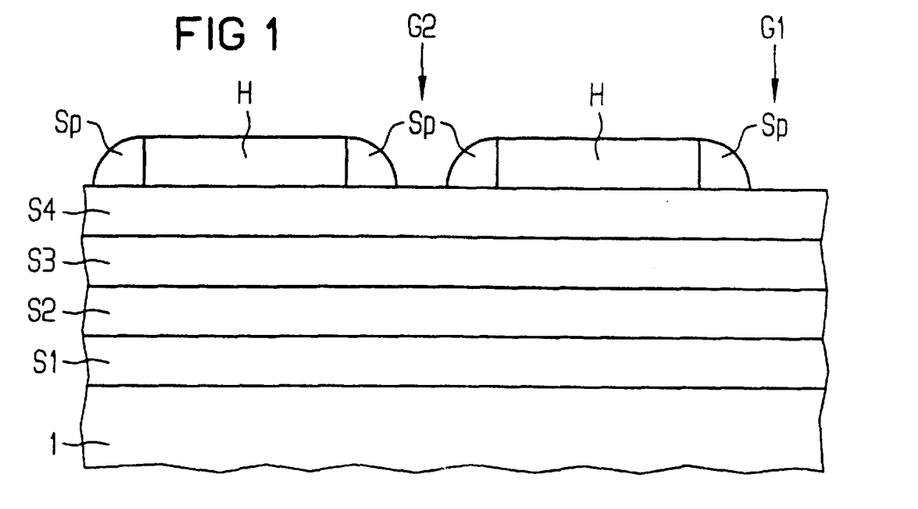
FIG. 1 is a partial sectional view taken through a substrate after a first layer, a second layer, a third layer, and a fourth layer have been grown on epitaxially, a first auxiliary layer has been deposited and structured and spacers have been produced.
Figure 10:
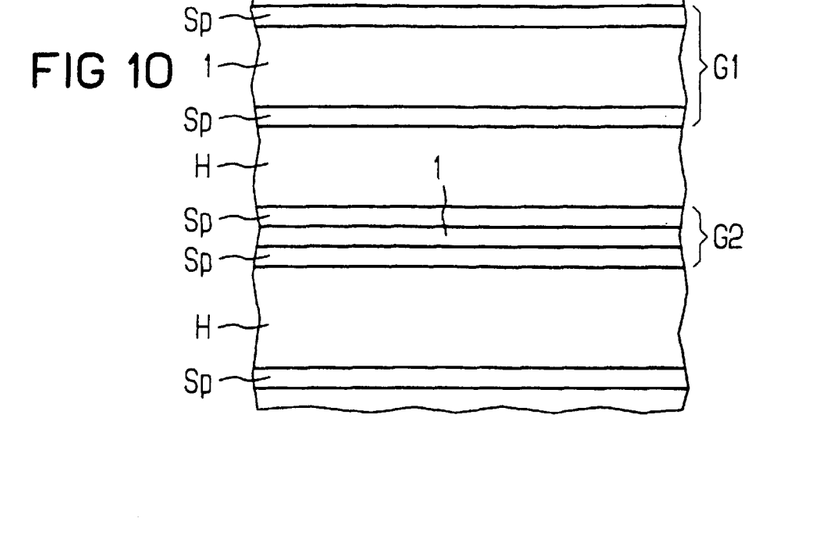
FIG. 10 is a partial plan view onto the substrate after an auxiliary layer, trenches, and spacers have been produced.

Referring now to the figures of the drawing in detail and first, particularly, to FIG. 1 thereof, the starting material is an n-doped substrate 1 made of silicon with a dopant concentration of approximately $10^{17}$ cm$^{-3}$. A layer sequence is produced on the substrate 1 by the following procedure: a p-doped first layer S1 with a thickness of approximately 100 nm, an n-doped second layer S2 with a thickness of approximately 100 nm, a p-doped third layer S3 with a thickness of approximately 100 nm and an n-doped fourth layer S4 with a thickness of approximately 100 nm are grown on by means of epitaxy with in-situ doping. The dopant concentrations of the first layer S1, of the second layer S2, of the third layer S3 and of the fourth layer S4 are approximately $10^{18}$ cm$^{-3}$. An auxiliary layer H made of $SiO_2$ and having a thickness of approximately 200 nm is deposited onto the layer sequence. A photolithographic process is carried out to structure the auxiliary layer H by producing first trenches G1 and second trenches G2 running parallel to one another. The first trenches G1 and the second trenches G2 run parallel to a z-axis z (see FIG. 1 and FIG. 10). The first trench G1 has a width of approximately 700 nm and the second trench G2 has a width of approximately 300 nm. A distance between the center lines of adjacent trenches is approximately 900 nm.

The spacers Sp are produced by depositing and then etching back silicon nitride. A first mask M1 is formed from the spacers Sp by silicon nitride being etched into strips running parallel to an x-axis x, which runs perpendicularly to the z-axis z. The strips have a width of approximately 900 nm and a distance between the center lines of adjacent strips is approximately 1200 nm (see FIG. 2 and FIG. 10).

Figure 2:
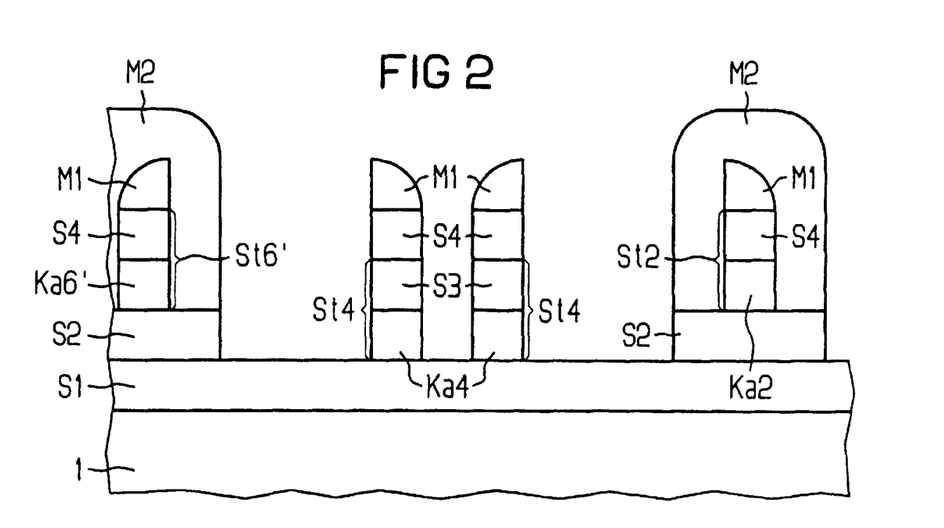
FIG. 2 is a similar section of the structure of FIG. 1 after a first mask, a second mask, and semiconductor structures have been produced.

Referring now to FIG. 2, silicon is etched with the aid of the first mask M1. In the process, the fourth layer S4 and the third layer S3 are cut through and the second layer S2 is uncovered. In the process, semiconductor structures St1, St2, St5, St6 of the first transistor, of the second transistor, of the fifth transistor and of the sixth transistor are formed and temporary semiconductor structures of the third transistor and of the fourth transistor are also formed. In order to produce a second mask M2 in strip form, whose strips have a width of approximately 300 nm, run parallel to the z-axis z and cover the first transistor, the second transistor, the fifth transistor and the sixth transistor and also regions surrounding them, $SiO_2$ is deposited and structured by means of a photolithographic process (see FIG. 2). Silicon is etched with the aid of the second mask M2 and the first mask M1 until the first layer S1 is partially uncovered. As a result, the semiconductor structures St3, St4 of the third transistor and of the fourth transistor are formed from the temporary semiconductor structures of the third transistor and of the fourth transistor. The mask M2 protects parts of the second layer S2 between the first transistor and the second transistor of a memory cell and between the sixth transistor and the fifth transistor along the x-axis x of adjacent memory cells.

Figure 3:
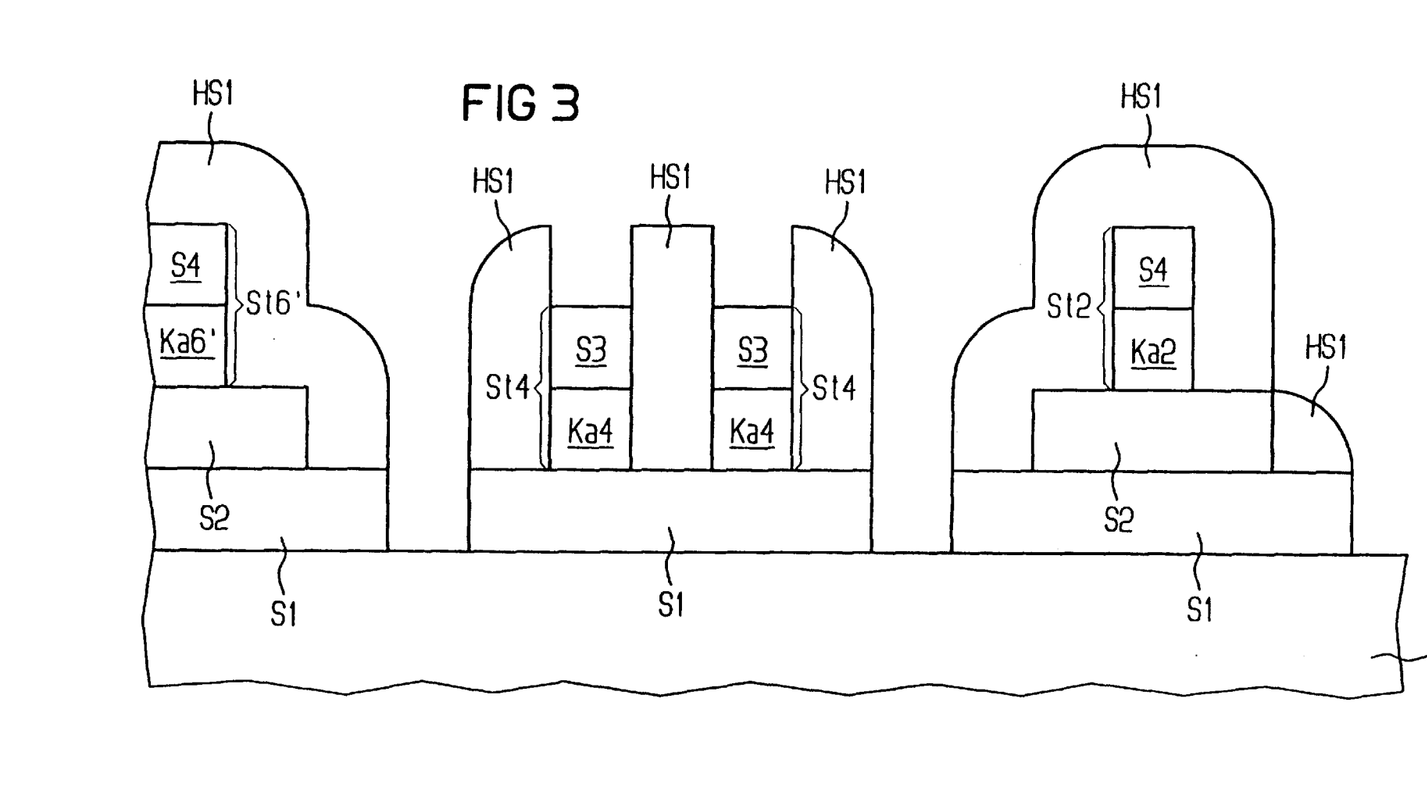
FIG. 3 is an enlarged view of a section of the structure after the first mask and the second mask have been removed, a first auxiliary structure has been produced, and parts of the first layer a the fourth layer have been removed.

The first mask M1 and the second mask M2 are subsequently removed using, for example, $NH_4F/HF$ and then $H_3PO_4$ at 150° C. A first auxiliary structure HS1 is then produced by depositing $SiO_2$ to a thickness of approximately 100 nm and etching it using a third mask in strip form (not illustrated), whose strips are somewhat wider than the second mask M2, until the fourth layer S4 is uncovered in the semiconductor structures St3, St4 of the third transistor and of the fourth transistor. Reference is had to FIG. 3. The fourth layer S4 and the first layer S1 are partially removed by etching silicon selectively with respect to $SiO_2$ using $Cl_2/CHF_3$, for example, until the third layer S3 and the substrate 1 are partially uncovered. As a result, adjacent transistors along the x-axis x are isolated from one another.

Figure 4:
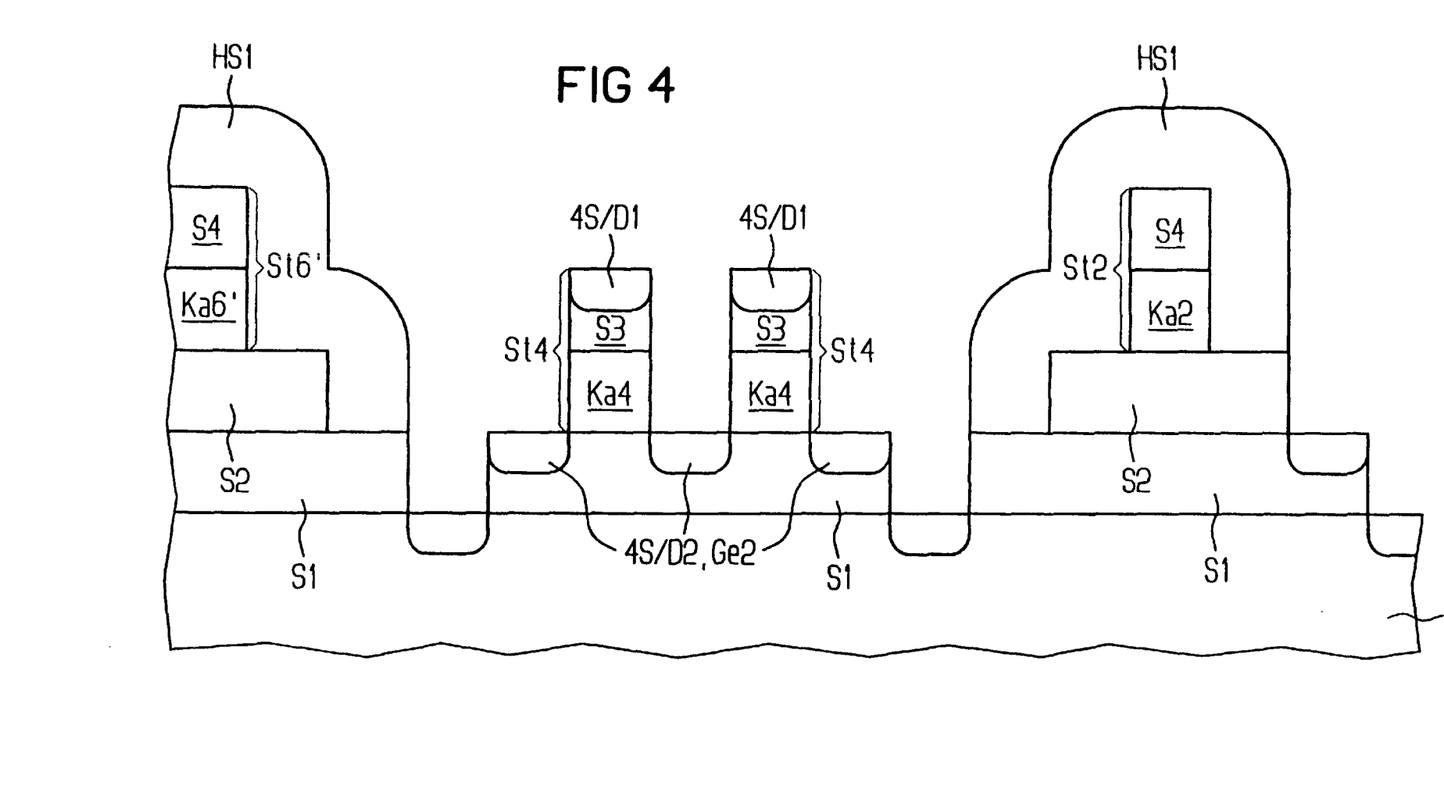
FIG. 4 is a similar section after the first auxiliary structure has been partially removed, source/drain regions of the third transistor (not illustrated) and of the fourth transistor and a second doped region have been produced.

With reference to FIG. 4, $SiO_2$ is etched selectively with respect to silicon using a non-illustrated fourth mask in strip form, which is analogous to the third mask. The $SiO_2$ is thereby etched, for example, with $CHF_3/CF_4$, until parts of the first auxiliary structure HS1 which adjoin sidewalls of the semiconductor structures St3, St4 of the third transistor and of the fourth transistor are removed.

Using the first auxiliary structure HS1 as a mask, the following are produced by means of implantation: a first source/drain region of the third transistor in parts of the third layer S3 of the semiconductor structures St3 of the third transistor, and first source/drain regions 4S/D1 of the fourth transistor in parts of the third layer S3 in the semiconductor structures St4 of the fourth transistor, a second doped region Ge2 in parts of the first layer S1, as part of the second doped region Ge2, adjoining sidewalls of the semiconductor structures St3 of the third transistor, second source/drain regions of the third transistor, and, as parts of the second doped region Ge2, adjoining sidewalls of the semiconductor structures St4 of the fourth transistor, second source/drain regions 4S/D2 of the fourth transistor (see FIG. 4). These source/drain regions are thus formed in a self-aligned manner with respect to one another, that is to say without using additional masks to be aligned. Subsequently, the first auxiliary structure HS1 is removed by etching $SiO_2$ selectively with respect to silicon using $NH_4F/HF$, for example.

Figure 5:
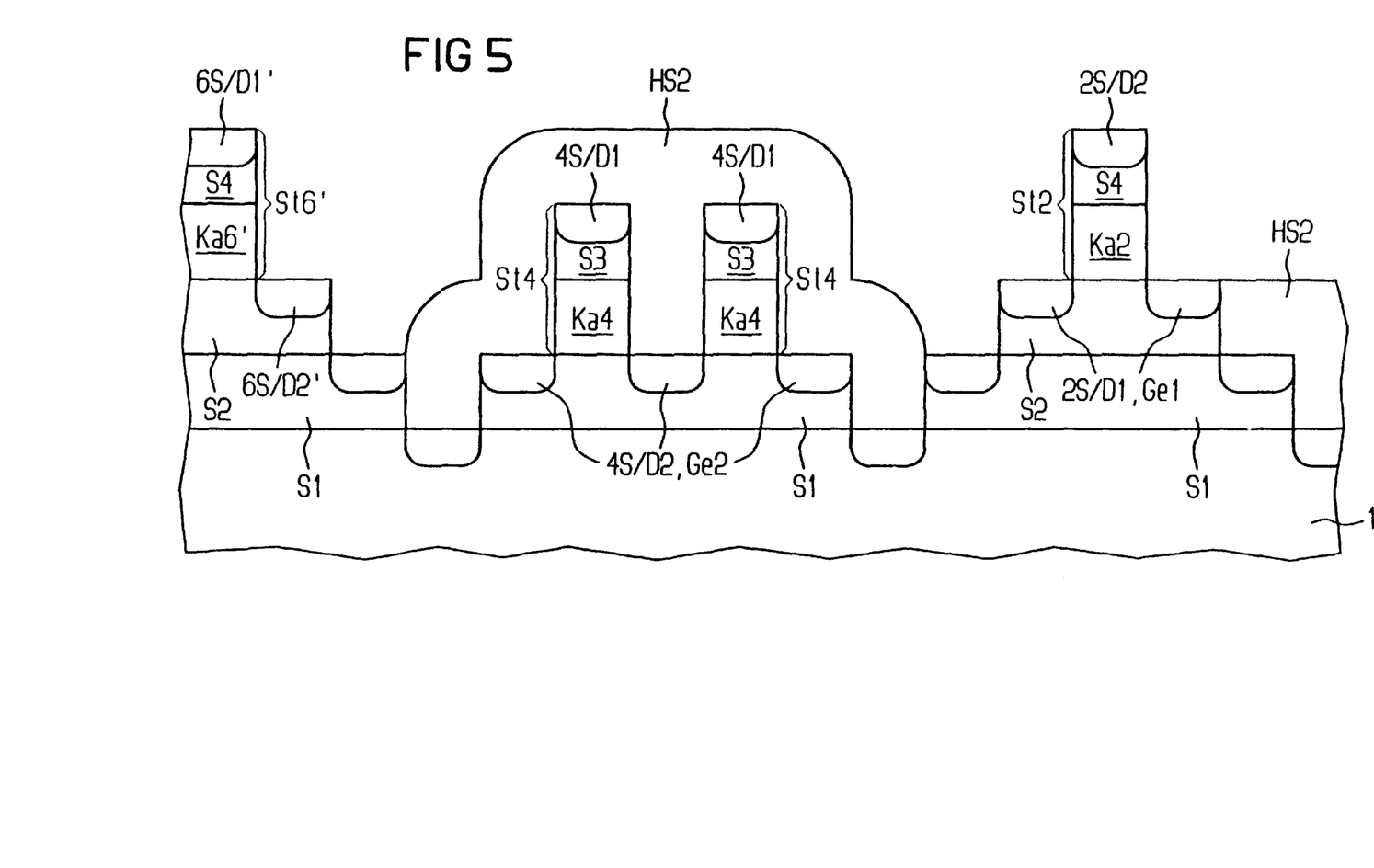
FIG. 5 is a partial sectional view of the FIG. 4 structure after the production of a second auxiliary structure, source/drain regions of the first transistor (not illustrated), of the second transistor, of the fifth transistor (not illustrated) and of the sixth transistor, a first doped region, a first bit line and a second bit line.
Figure 11:
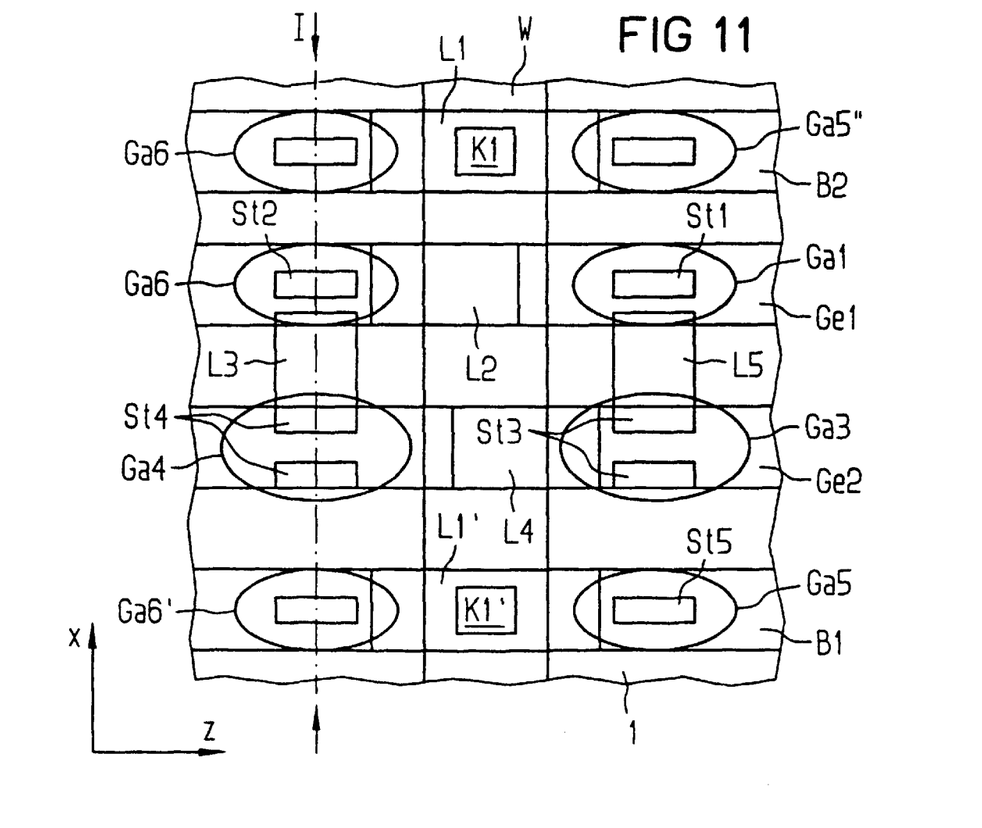
FIG. 11 is a partial plan view illustrating semiconductor structures, gate electrodes, conductive structures overlapping the gate electrodes, and a word line.

In order to produce a second auxiliary structure HS2, $SiO_2$ is deposited to a thickness of approximately 100 nm and structured with the aid of a fifth mask, which is complementary to the fourth mask. The second auxiliary structure HS2 is in strip form and covers the semiconductor structures St3, St4 of the third transistor and of the fourth transistor and also surrounding regions. Using the second auxiliary structure HS2 as a mask, the following are produced by means of implantation: an n-doped second source/drain region of the first transistor in a part of the fourth layer S4 which is situated in the semiconductor structure St1 of the first transistor, a second source/drain region 2S/D2 of the second transistor in a part of the fourth layer S4 which is situated in the semiconductor structure St2 of the second transistor, a first source/drain region of the fifth transistor in a part of the fourth layer S4 which is situated in the semiconductor structure St5 of the fifth transistor, a first source/drain region of the sixth transistor in a part of the fourth layer S4 which is situated in the semiconductor structure St6 of the sixth transistor, a first doped region Ge1 in a part of the second layer S2 which is in strip form and overlaps the semiconductor structure St2 of the second transistor and the semiconductor structure St1 of the first transistor, a first bit line B1 and a second bit line B2 in parts of the second layer S2 which are in strip form and overlap the semiconductor structures St5, St6 of the fifth transistor and of the sixth transistor of adjacent memory cells along the x-axis x (see FIG. 5 and FIG. 11). The first bit line B1 serves as second bit line for a first memory cell adjacent to the memory cell along the x-axis x. A second source/drain region 6S/D2' of a sixth transistor of the first adjacent memory cell is thus part of the first bit line B1. The second bit line B2 serves as first bit line for a second memory cell adjacent to the memory cell along the x-axis x. A second source/drain region of a fifth transistor of the second adjacent memory cell is thus part of the second bit line B2. The second auxiliary structure HS2 is subsequently removed by etching with $NH_4F/HF$, for example.

Figure 6:
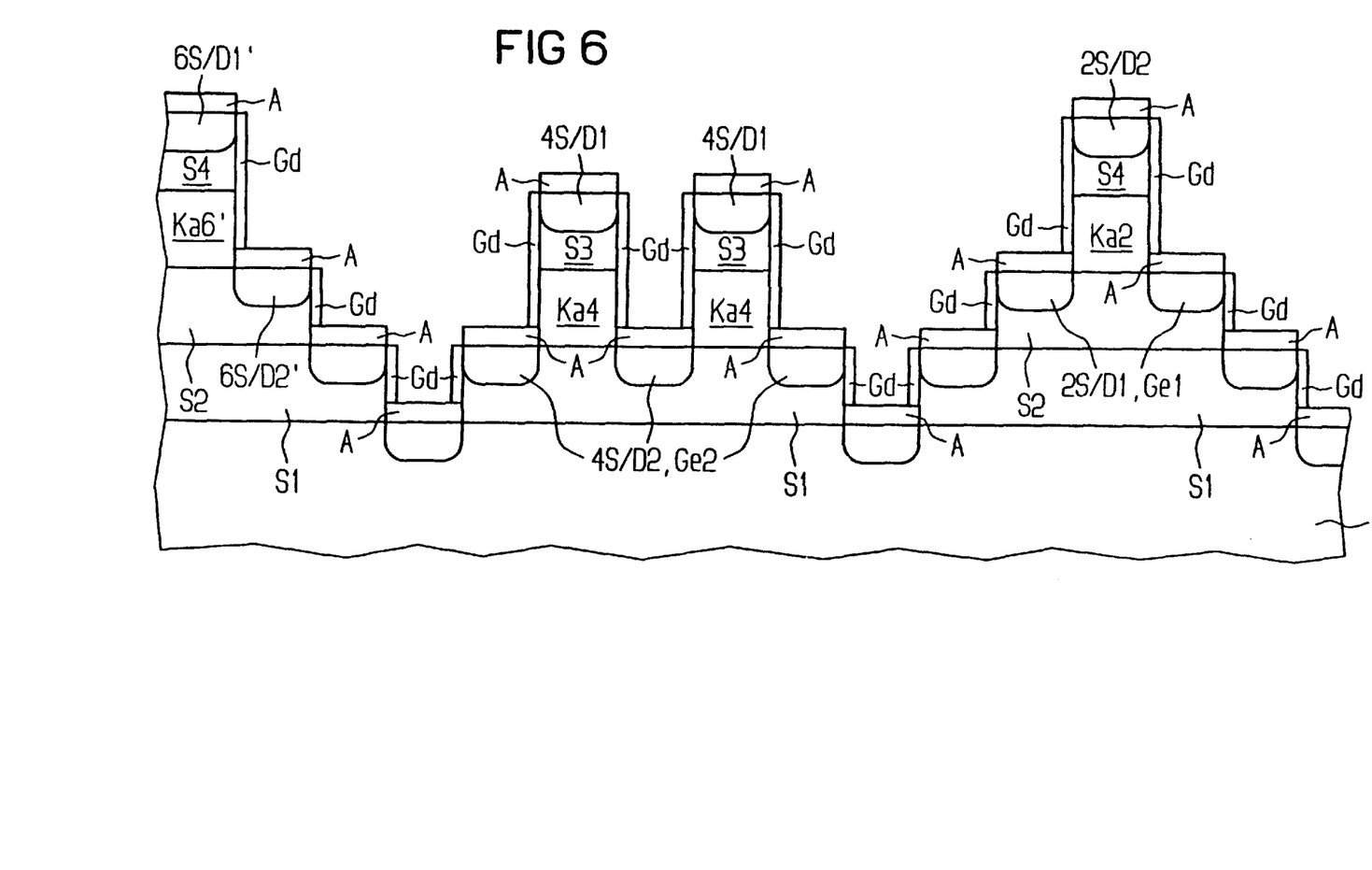
FIG. 6 is a partial section of the structure of FIG. 5 after a spacer layer and a gate dielectric have been produced.

With reference to FIG. 6: Spacer layers A having a thickness of approximately 20 nm are formed on horizontal areas by anisotropic application of $SiO_2$ and isotropic removal using $NH_4F/HF$, for example, until $SiO_2$ is removed from the sidewalls of the semiconductor structures St1, St2, St3, St4, St5, St6. After a cleaning step, a gate dielectric Gd having a thickness of approximately 5 nm is produced by means of thermal oxidation (see FIG. 6).

In order to produce gate electrodes and conductive structures, in-situ doped polysilicon is deposited and etched with the aid of a non-illustrated sixth mask until gate electrodes in spacer form surround, at the level of the channel regions, the semiconductor structures St1, St2, St3, St4, St5, St6 of the transistors. The sixth mask covers a part between the fifth transistor and the sixth transistor of adjacent memory cells along the z-axis z in such a way that a first conductive structure, for example L1 or L1', is formed, which overlaps a fifth gate electrode, for example Ga5 or Ga5", and a sixth gate electrode, for example Ga6 or Ga6', of these transistors. The sixth mask covers a region between the second transistor and the first transistor in such a way that a second conductive structure L2 is formed which overlaps the second gate electrode Ga2 of the second transistor. The sixth mask covers a region between the second transistor and the fourth transistor in such a way that a third conductive structure L3 is formed, which overlaps a second gate electrode Ga2 of the second transistor and the fourth gate electrode Ga4 of the fourth transistor. The sixth mask covers a region between the fourth transistor and the third transistor in such a way that a fourth conductive structure L4 is formed, which overlaps a third gate electrode Ga3 of the third transistor. The sixth mask covers a region between the first transistor and the third transistor in such a way that a fifth conductive structure L5 is formed, which overlaps the first gate electrode Ga1 and the third gate electrode Ga3 (see FIG. 11). The spacer layers A reduce capacitances which are each formed by a gate electrode and a source/drain region situated underneath.

Figure 7:
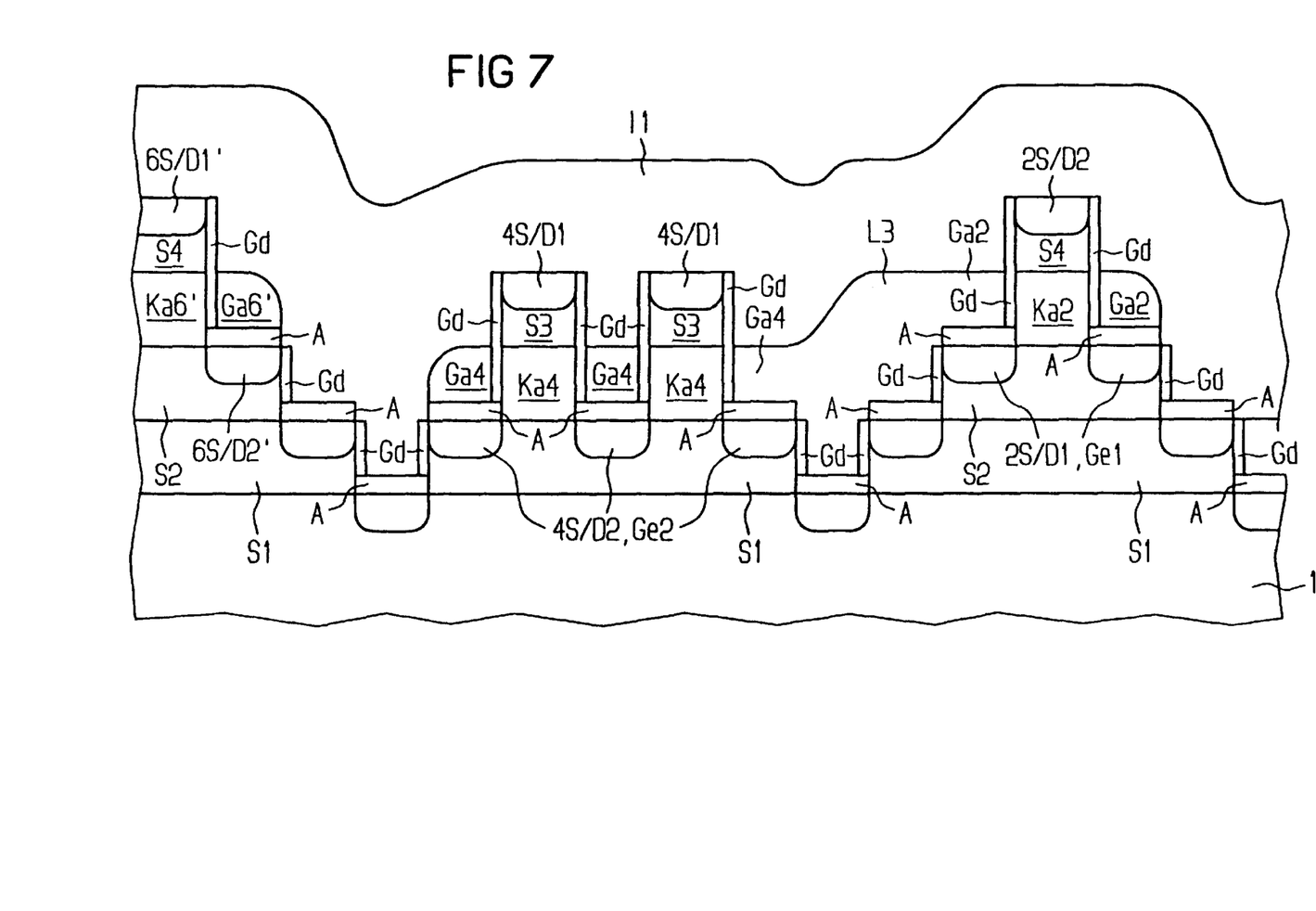
FIG. 7 is a partial sectional view after gate electrodes, conductive structures, and a first insulating structure have been produced.
Figure 8:
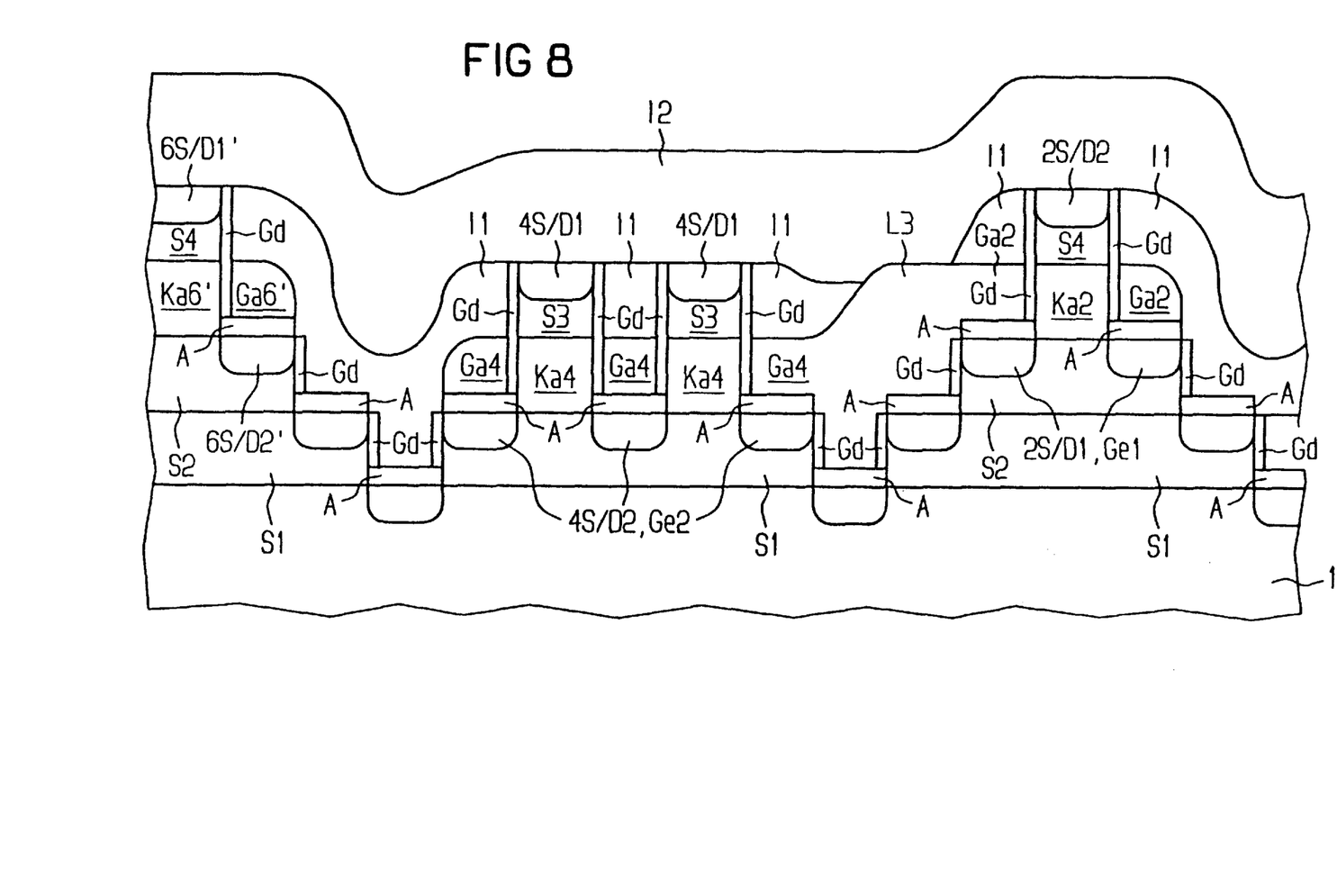
FIG. 8 is a partial sectional view after a second insulating structure has been produced.
Figure 9:
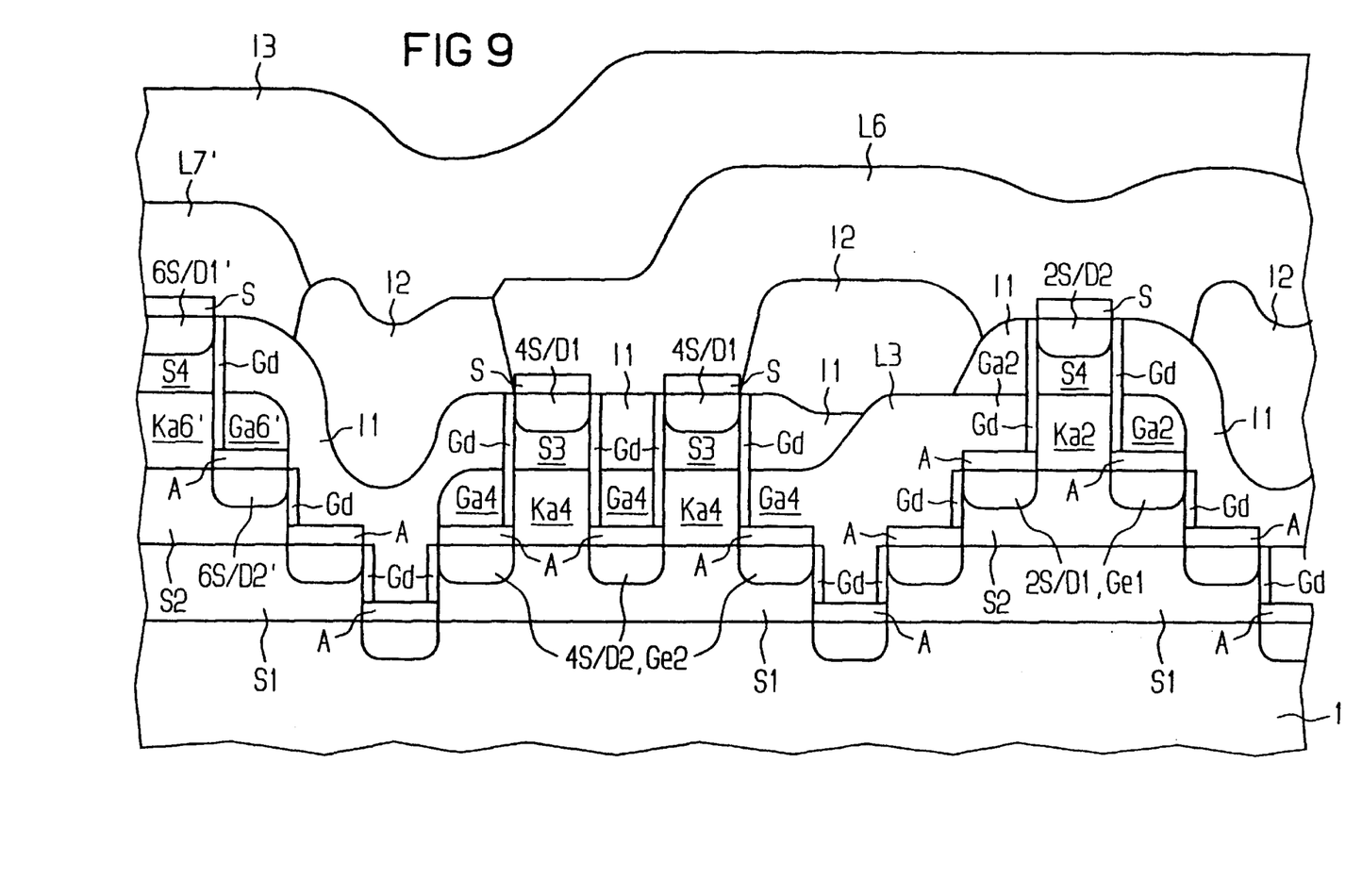
FIG. 9 is a similar view of the structure after the production of conductive structures, a third insulating structure, silicide layers, contacts (not illustrated) and word lines (not illustrated)

In order to produce a first insulating structure I1, $SiO_2$ is deposited to a thickness of approximately 100 nm and etched back until the first source/drain region of the third transistor, the first source/drain region 4S/D1 of the fourth transistor, the first source/drain region of the sixth transistor, the first source/drain region of the fifth transistor, the second source/drain region of the first transistor, the second source/drain region 2S/D2 of the second transistor, are uncovered (see FIG. 7 and FIG. 8). In order to insulate possibly uncovered parts of the third conductive structure L3 and of the fifth conductive structure L5, a second insulating structure Id is produced by depositing silicon nitride to a thickness of approximately 100 nm and etching it with the aid of a non-illustrated seventh mask, which does not cover the second source/drain region of the first transistor, the second source/drain region 2S/D2 of the second transistor, the first source/drain regions of the third transistor, the first source/drain regions 4S/D1 of the fourth transistor, the first source/drain region of the fifth transistor, the first source/drain region of the sixth transistor, parts of the first conductive structure L1, parts of the second conductive structure L2 and parts of the fourth conductive structure L4.

Selective siliconization is subsequently carried out, as a result of which silicide layers S are formed on uncovered areas made of silicon.

Figure 12:
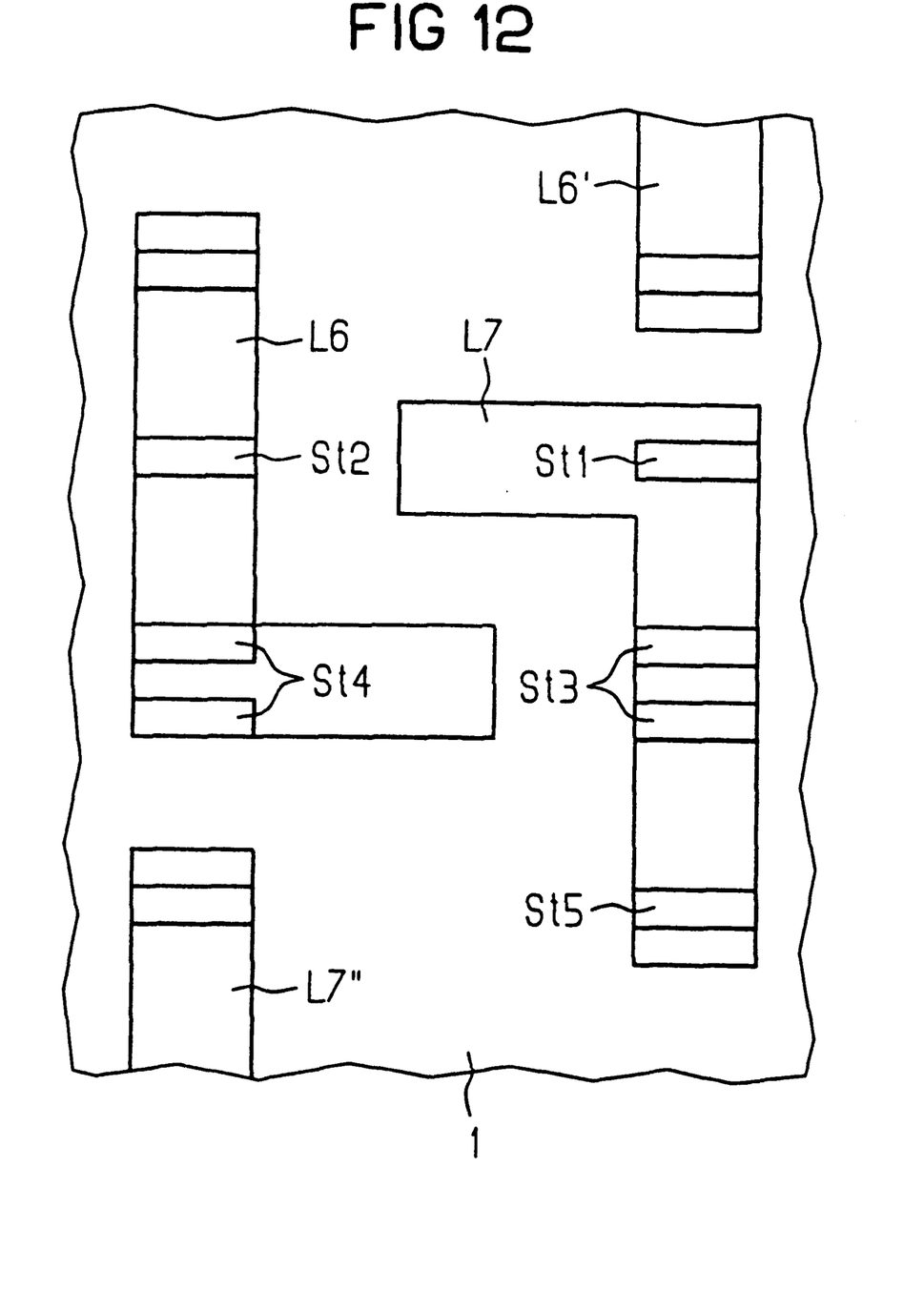
FIG. 12 is a partial plan view illustrating the semiconductor structures and conductive structures.
Figure 13:
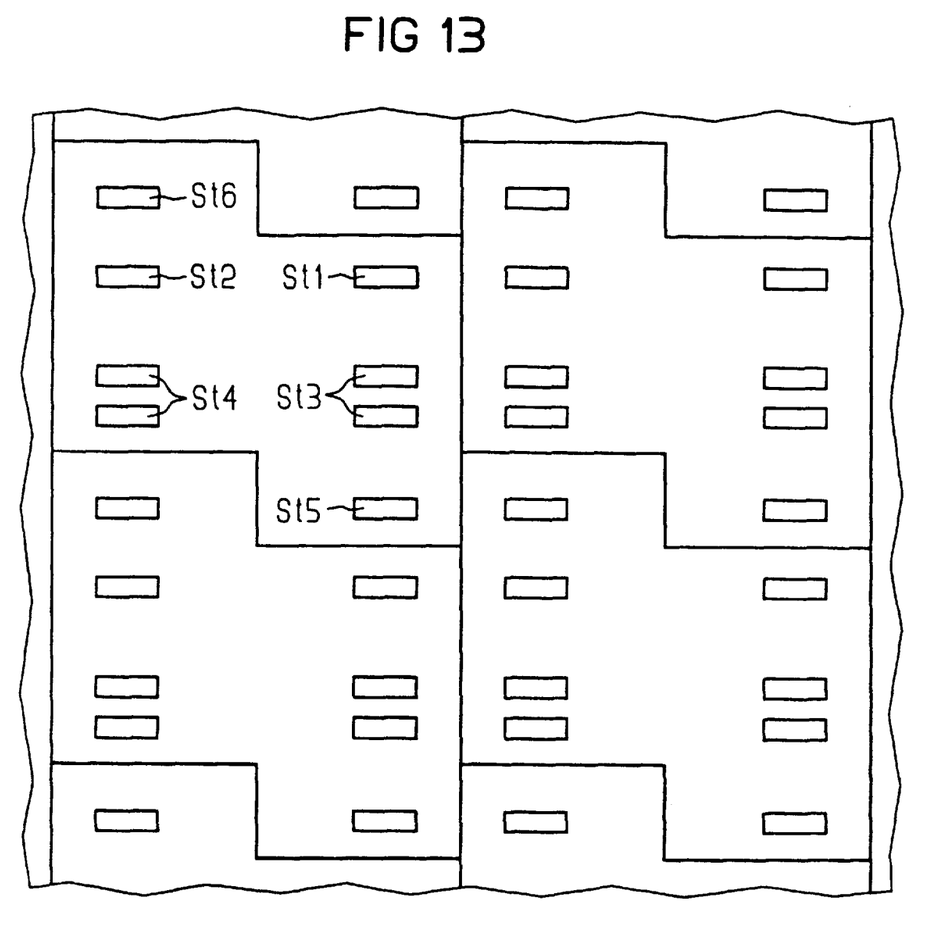
FIG. 13 is a partial plan view onto the novel arrangement of the memory cells.

Aluminum is subsequently deposited to a thickness of approximately 300 nm and structured, thereby producing an L-shaped sixth conductive structure L6, an L-shaped seventh conductive structure L7 and a lower part of a first contact K1, K1', which adjoins the first conductive structure L1, L1'. The sixth conductive structure L6 connects the first source/drain region of the sixth transistor, the second source/drain region 2 S/D2 of the second transistor, the first source/drain regions 4 S/D1 of the fourth transistor and the fourth conductive structure L4 to one another. The seventh conductive structure L7 connects the second conductive structure L2, the second source/drain region of the first transistor, the first source/drain regions of the third transistor and the first source/drain region of the fifth transistor to one another (see FIG. 12).

A third insulating structure I3 is subsequently produced by applying SiO$_2$ to a thickness of approximately 300 nm. A contact hole which reaches right down to the lower part of the first contact K1, K1' is produced by etching using CHF$_3$/O$_2$ for example. Aluminum is subsequently deposited and structured, thereby producing in the contact hole an upper part of the first contact K1, K1' and, adjoining the latter, a word line W running parallel to the x-axis x (see FIG. 11).

The connections between parts of the transistors of the SRAM cell configuration of the exemplary embodiment are summarized below: the first source/drain region of the first transistor is connected to the first source/drain region of the second transistor and to the first voltage terminal. The second source/drain region of the first transistor is connected to the first source/drain region of the third transistor, to the first source/drain region of the fifth transistor, to the second gate electrode and the fourth gate electrode. The first gate electrode is connected to the second source/drain region of the second transistor, to the first source/drain region of the fourth transistor, to the third gate electrode and to the first source/drain region of the sixth transistor. The second source/drain region of the third transistor is connected to the second source/drain region of the fourth transistor and to the second voltage terminal. The second source/drain region of the fifth transistor is connected to the first bit line. The fifth gate electrode is connected to a sixth gate electrode and to the word line. The second source/drain region of the sixth transistor is connected to the second bit line. The third transistor and the fourth transistor are complementary to the first transistor, to the second transistor, to the fifth transistor and to the sixth transistor.

There are many conceivable variations of the exemplary embodiment which likewise lie within the scope of the invention. In particular, the dimensions of the described layers, regions, masks and structures can be adapted to the respective requirements. The same also applies to the dopant concentrations proposed. The semiconductor structure does not have to be web-shaped, but rather can be adapted to the respective requirements. The sidewalls of the semiconductor structure do not have to run perpendicularly to the surface of the semiconductor structure, but rather can form any desired angle with the surface of the semiconductor structure. Bit line and word line do not have to run perpendicularly to one another, but rather can form any desired angle. Masks and layers made of SiO2 can be produced by means of thermal oxidation or by means of a deposition process. Polysilicon can be doped not only during but also after the deposition. Instead of doped polysilicon, it is also possible to use, for example, metal silicides and/or metals.

We claim:

1. An SRAM cell configuration, comprising:

a plurality of memory cells each including at least a first transistor, a second transistor, a third transistor, a fourth transistor, a fifth transistor, and a sixth transistor;

said first transistor, said second transistor, said third transistor, and said fourth transistor forming a flip-flop circuit connected between a first voltage terminal and a second voltage terminal, and being driven via said fifth transistor and via said sixth transistor;

said third transistor and said fourth transistor being complementary to said first transistor and to said second transistor;

a first bit line, a second bit line, and a word line, said first bit line and said second bit line extending transversely with respect to the word line;

said fifth transistor and said sixth transistor being driven via said word line;

said fifth transistor having a second source/drain region connected to said first bit line; said sixth transistor having a second source/drain region connected to said second bit line;

said first transistor, said second transistor, said third transistor, and said fourth transistor being arranged at corners of a quadrilateral whereby said first transistor and said fourth transistor is disposed at diagonally opposite corners thereof;

said third transistor being arranged between said first transistor and said fifth transistor; and said second transistor being arranged between said fourth transistor and said sixth transistor.

2. The SRAM cell configuration according to claim 1, wherein:

said first transistor, said third transistor, and said fifth transistor are arranged next to one another in a direction of said word line;

said second transistor, said fourth transistor, and said sixth transistor are arranged next to one another in the direction of said word line;

a connecting line between a corner at which said first transistor is disposed and a corner at which said second transistor is disposed runs parallel to a z-axis extending transversely with respect to said word line; and a connecting line between a corner at which said third transistor is disposed and a corner at which said fourth transistor is disposed runs parallel to the z-axis.

3. The SRAM cell configuration according to claim 2, wherein:

said plurality of memory cells includes a first memory cell and a second memory cell adjacent to said first memory cell along said word line;

a connecting line between one of said transistors of said first memory cell and one of said transistors of said second memory cell runs parallel to the z-axis; and said first memory cell and said second memory cell are translationally symmetrical or rotationally symmetrical through 180° relative to one another.

4. The SRAM cell configuration according to claim 3, wherein:

said word line is disposed between said sixth transistor of said first memory cell and said fifth transistor of said second memory cell along said word line of respectively adjacent memory cells;

and including a first conductive structure connecting a gate electrode of said sixth transistor of said first memory cell with a gate electrode of said fifth transistor of said second memory cell; and a first contact connecting said first conductive structure to said word line.

5. The SRAM cell configuration according to claim 1, wherein said transistors include p-channel transistors and n-channel transistors, and wherein said p-channel transistors have channel widths approximately twice as large as channel widths of said n-channel transistors.

6. The SRAM cell configuration according to claim 1, wherein at least one of said first transistor, said second transistor, said third transistor, said fourth transistor, said fifth transistor, and said sixth transistor are vertical MOS transistors.

7. The SRAM cell configuration according to claim 6, wherein:

said first transistor, said second transistor, said third transistor, and said fourth transistor are vertical MOS transistors;

a y-axis is defined perpendicularly to a surface of a substrate;

a height with regard to said y-axis of a channel region of said third transistor corresponds to a height of a channel region of said fourth transistor;

a height with regard to said y-axis of a channel region of said first transistor corresponds to a height of a channel region of said second transistor; and the height of the channel region of said first transistor and the height of the channel region of said third transistor are different from one another.

8. The SRAM cell configuration according to claim 2, wherein:

said second source/drain region of said fifth transistor forms a part of said first bit line;

said second source/drain region of said sixth transistor forms a part of said second bit line;

said first bit line and said second bit line are each formed as a strip disposed in a substrate;

including a first doped region formed as a strip disposed in the substrate, said first doped region connecting said first source/drain region of said first transistor to said first source/drain region of said second transistor and to a first voltage terminal;

including a second doped region formed as a strip disposed in the substrate, said second doped region connecting said second source/drain region of said third transistor to said second source/drain region of said fourth transistor and to a second voltage terminal;

said first doped region, said second doped region, said first bit line, and said second bit line extending substantially parallel to the z-axis.

* * * * *